(12) United States Patent
Inagaki et al.

(10) Patent No.: US 7,906,217 B2
(45) Date of Patent: Mar. 15, 2011

(54) VAPOR DEPOSITED FILM BY PLASMA CVD METHOD

(75) Inventors: Hajime Inagaki, Yokohama (JP); Toshihide Ieki, Yokohama (JP); Satoru Kitou, Yokohama (JP); Ryuta Nakano, Yokohama (JP); Megumi Nakayama, Yokohama (JP)

(73) Assignee: Toyo Seikan Kaisha, Ltd., Tokyo (JP)

( * ) Notice: Subject to any disclaimer, the term of this patent is extended or adjusted under 35 U.S.C. 154(b) by 783 days.

(21) Appl. No.: 11/884,772

(22) PCT Filed: Feb. 7, 2006

(86) PCT No.: PCT/JP2006/302426
§ 371 (c)(1),
(2), (4) Date: Sep. 21, 2007

(87) PCT Pub. No.: WO2006/090602
PCT Pub. Date: Aug. 31, 2006

(65) Prior Publication Data
US 2009/0148633 A1    Jun. 11, 2009

(30) Foreign Application Priority Data

Feb. 22, 2005  (JP) .................. 2005-045015
May 11, 2005  (JP) .................. 2005-137982

(51) Int. Cl.
B32B 1/08      (2006.01)
B32B 7/00      (2006.01)
B32B 9/00      (2006.01)
B32B 18/00     (2006.01)
B32B 33/00     (2006.01)

(52) U.S. Cl. ...... 428/469; 428/34.4; 428/34.6; 428/34.7; 428/35.8; 428/35.9; 428/36.7; 428/36.91; 428/457

(58) Field of Classification Search ................ 428/34.1, 428/34.4, 34.6, 34.7, 35.7, 35.8, 35.9, 36.4, 428/36.6, 36.7, 36.9, 36.91, 457, 469, 688, 428/689, 702
See application file for complete search history.

(56) References Cited

U.S. PATENT DOCUMENTS

| 6,117,541 | A * | 9/2000 | Frisk .......................... 428/327 |
| 2003/0044552 | A1 | 3/2003 | Komada |
| 2004/0247948 | A1 | 12/2004 | Behle et al. |
| 2006/0138099 | A1 | 6/2006 | Namiki et al. |
| 2006/0264044 | A1 | 11/2006 | Kobayashi et al. |

FOREIGN PATENT DOCUMENTS

| EP | 1 388 593 A2 | 2/2004 |
| EP | 1 388 594 A2 | 2/2004 |
| JP | 2003-53873 A | 2/2003 |
| JP | 2005-89859 A | 4/2005 |
| WO | 03/014415 A1 | 2/2003 |
| WO | 2004/033753 A1 | 4/2004 |
| WO | 2004/087989 A1 | 10/2004 |

* cited by examiner

*Primary Examiner* — Walter B Aughenbaugh
(74) *Attorney, Agent, or Firm* — Sughrue Mion, PLLC

(57) ABSTRACT

A vapor deposited film is formed on a base material surface by a plasma CVD method where an organic metal compound and an oxidizing gas are used as a reactive gas. The vapor deposited film has three sections of a base material side adhesive layer having 5% or more carbon, a barrier intermediate layer having less than 5% carbon, and a surface protection film having 5% or more carbon, by element concentration with respect to the total amount of three elements of a metal element (M), oxygen (O) and carbon (C) derived from the organic metal compound. The vapor deposited film has excellent adhesiveness to the base material, and has excellent resistance to water, especially to alkaline aqueous solutions, as well.

9 Claims, 9 Drawing Sheets

VAPOR DEPOSITED FILM BY PLASMA CVD METHOD

TECHNICAL FIELD

The present invention relates to a vapor deposited film formed on the surface of a base material such as a plastic bottle by a plasma CVD method.

BACKGROUND ART

In order to improve properties of various base materials, a film has heretofore been formed by vapor deposition on their surfaces by the plasma CVD method. In the field of packing materials, for instance, it is a known practice to form a film by vapor deposition on a plastic base material such as of a container relying on the plasma CVD method in order to improve the gas barrier property.

For example, there has been known a method of producing a plastic container by forming a vapor deposited film (barrier layer) containing a silicon oxide and a compound of at least one kind of element selected from carbon, hydrogen, silicon and oxygen on the outer surface or the inner surface of the plastic container relying on the plasma CVD method by using an organic silicon compound and oxygen or a gas having an oxidizing capability, while varying the concentration of the organic silicon compound (see patent document 1).

A gas-barrier film has also been known comprising a base member, a gas-barrier layer (vapor deposited film) formed on one surface or on both surfaces of the base member, and a water-repelling film (water-repelling layer) formed on the gas-barrier layer (see patent document 2).

Patent document 1: JP-A-2000-255579
Patent document 2: JP-A-2003-53873

The vapor deposited film formed by the method of the patent document 1 may exhibit excellent barrier effect against various gases such as oxygen and the like but has low durability against water permitting silicon to elute out in an alkaline aqueous solution such as mineral water. In the field of packing materials, therefore, it has been desired to improve the adhesion of film to the base material and such kind of elution. A gas-barrier film disclosed in the patent document 2 exhibits durability which is improved to some extent against water since a water-repelling layer has been formed on the surface of the gas-barrier layer which is the vapor deposited film. However, the degree of improvement is not sufficient. Even by forming the water-repelling layer, therefore, it is not possible to sufficiently suppress the elution of silicon into the alkaline aqueous solution.

The vapor deposited film of a metal oxide as represented by a silicon oxide exhibits a high gas-barrier property but lacks flexibility and exhibits a low adhesiveness to the base material on which the film is vapor deposited and, particularly, to a plastic base material. Therefore, in case the film is vapor deposited on a plastic container or the like, the vapor deposited film cannot follow the deformation of the container caused by the expansion or the like, arousing a problem of a great decrease in the gas-barrier property.

To avoid the above problems, the present applicant has previously proposed forming a vapor deposited film by adjusting the reaction conditions at the time of forming a vapor deposited film of a metal oxide by the plasma CVD method by, first, using an organic metal compound as a starting gas, forming an organic layer having a high carbon concentration rich in organic property on the surface side of the base material, and continuously forming a metal oxide layer rich in inorganic property having a high metal concentration on the organic layer (see patent document 3). In the thus formed vapor deposited film, an organic layer is formed on the lower side of the metal oxide layer having a high gas-barrier property, i.e., on the surface side of the base material. Therefore, the vapor deposited film exhibits excellent gas-barrier property, high adhesiveness to the base material such as plastic material, and excellent flexibility.

Patent document 3: JP-A-2005-89859

However, the vapor deposited film disclosed in the patent document 3, too, still leaves much room for improvement. That is, the vapor deposited film having a layer structure in which an organic layer having a high carbon concentration is formed on the side of the surface of the base material and an inorganic metal oxide layer having a high gas-barrier property is formed on the above organic layer, has a defect of low heat resistance. Therefore, if the vapor deposited film is formed on the surface of the plastic container, the metal in the vapor deposited film elutes out into the content solution and the film thickness decreases particularly when the container is filled with the solution of a high temperature or when the container is preserved at a relatively high temperature (50 to 60° C.).

DISCLOSURE OF THE INVENTION

It is, therefore, an object of the present invention to provide a vapor deposited film by the plasma CVD method having not only good adhesiveness to the base material but also excellent resistance against water and, particularly, against an alkaline aqueous solution.

Another object of the present invention is to provide a vapor deposited film by the plasma CVD method having excellent heat resistance.

According to the present invention, there is provided a vapor deposited film formed on a surface of a base material by a plasma CVD method by using an organic metal compound and an oxidizing gas as reaction gases;

wherein the vapor deposited film is sectionalized into an adhesive layer on the side of the base material having a carbon concentration of not less than 5 element %, an intermediate barrier layer having a carbon concentration of less than 5 element % and a surface protection layer having a carbon concentration of not less than 5 element % on the total basis of three elements of a metal element (M), oxygen (O) and carbon (C) derived from the organic metal compound;

the surface protection layer has a carbon (C) concentration of higher than an oxygen (O) concentration and a metal element (M) concentration, and, in a surface of the surface protection layer, an element ratio (O/M) representing the degree of oxidation of the metal element (M) is not larger than 1.3, and the bonding energy of the metal element (M) is smaller than an average value of the bonding energy of the metal element of the intermediate barrier layer by not less than 1.0 eV; and in the intermediate barrier layer, the element ratio (O/M) representing the degree of oxidation of the metal element (M) on average is larger than 1.8 but is not larger than 2.4.

According to the present invention, there is further provided a plastic bottle having the vapor deposited film formed on the inner surface thereof.

In the present invention, the element concentrations, the element ratio (O/M) representing the degree of oxidation of the metal element (M) and the bonding energy of the metal element (M) on the surface of the surface protection layer are all those values measured at a depth of 0.3 nm from the surface by using an X-ray photoelectron spectroscopic analyzing apparatus. The values are not measured on the surface in order to avoid the effect of contamination and the like.

In the vapor deposited film of the present invention, it is desired that:

(1) The adhesive layer on the side of the base material includes an organic/inorganic composite region in which the element ratio (C/M) and the element ratio (O/M) satisfy the following formulas:

$0.2<C/M<1.8$, $1.5 \leq O/M$, and the bonding energy of the metal element (M) is in a range lower by 0.1 eV to 0.7 eV than an average value of the metal element (M) in the intermediate barrier layer;

(2) Except the surface protection layer, the region present on the organic/inorganic composite region has the element ratio (C/M) satisfying the following formula, $C/M \leq 0.2$; and (3) The organic/inorganic composite region has the bonding energy of the metal element (M) which gradually increases from the side of the base material toward the inorganic region, and wherein a difference is not smaller than 0.1 eV between a maximum value and a minimum value of bonding energy of the metal element (M).

The vapor deposited film according to the present invention is formed by the plasma CVD method by using an organic metal compound and an oxidizing gas as reaction gases. In the vapor deposited film are formed an adhesive layer on the side of the base material (hereinafter simply called adhesive layer), an intermediate barrier layer and a surface protection layer from the side of the base material toward the surface side.

The adhesive layer is a region having a carbon concentration of not less than 5 element %, has a high carbon concentration and is rich in organic property. Therefore, the vapor deposited film of the present invention exhibits a high adhesiveness to the base material.

The intermediate barrier layer formed on the adhesive layer is a region having a carbon concentration of less than 5 element % and chiefly comprises an oxide of the metal element (M), i.e., is rich in inorganic property and has an element ratio (O/M) that represents the degree of oxidation of the metal element (M) which on average is larger than 1.8 but is not larger than 2.4. Therefore, the intermediate barrier layer exhibits a high gas-barrier property.

Further, the surface protection layer formed on the intermediate barrier layer satisfies such conditions that the carbon (C) concentration is higher than the oxygen (O) concentration and the metal element (M) concentration, the element ratio (O/M) representing the degree of oxidation of the metal element (M) is not larger than 1.3, and the bonding energy of the metal element (M) is smaller than the average value of bonding energy of the metal element in the intermediate barrier layer by not less than 1.0 eV in the surface thereof (i.e., at a portion of a depth of 0.3 nm from the outer surface of the vapor deposited film). That is, the surface protection layer is a region where the organic degree is higher than that in the intermediate barrier layer. Therefore, as will become obvious from Examples appearing later, the vapor deposited film of the present invention exhibits excellent resistance against the alkaline aqueous solution without permitting the metal element (M) to elute into, for example, the alkaline aqueous solution. Therefore, the plastic bottle having the vapor deposited film formed on the inner surface can be put into practical use as a container for containing mineral water and alkaline ionic beverages.

In the above inorganic vapor deposited film, further, the carbon concentration (C) gradually decreases and, at the same time, the oxygen (O) concentration and the metal (M) concentration gradually increase from the interfacial side to the base material surface toward the intermediate barrier layer. Therefore, the organic/inorganic composite region exhibiting organic property as well as inorganic property is formed in the adhesive layer on the side of the base material near the intermediate barrier layer. In the present invention, it is desired that the element concentrations are so adjusted that the organic/inorganic composite region satisfies the following formulas, $0.2<C/M<1.8$, $1.5 \leq O/M$, and the bonding energy of the metal element (M) is in a range lower by 0.1 eV to 0.7 eV than the average value of the metal element (M) in the intermediate barrier layer. That is, upon forming the organic/inorganic composite region that satisfies the above conditions, the vapor deposited film exhibits excellent heat resistance. For example, upon forming the above vapor deposited film on the inner surfaces of the plastic bottles, the metal element does not almost elute out into the content solution even when the bottle is maintained at high temperatures for extended periods of time or even when the bottle is filled with the hot solution, effectively avoiding a decrease in the film thickness or a decrease in the gas-barrier property caused by a decrease in the film thickness. Therefore, the plastic bottles having the vapor deposited film including the organic/inorganic composite region formed on the inner surfaces thereof, can be particularly preferably used as vending containers for serving hot teas and the like.

BEST MODE FOR CARRYING OUT THE INVENTION

Figure 1:
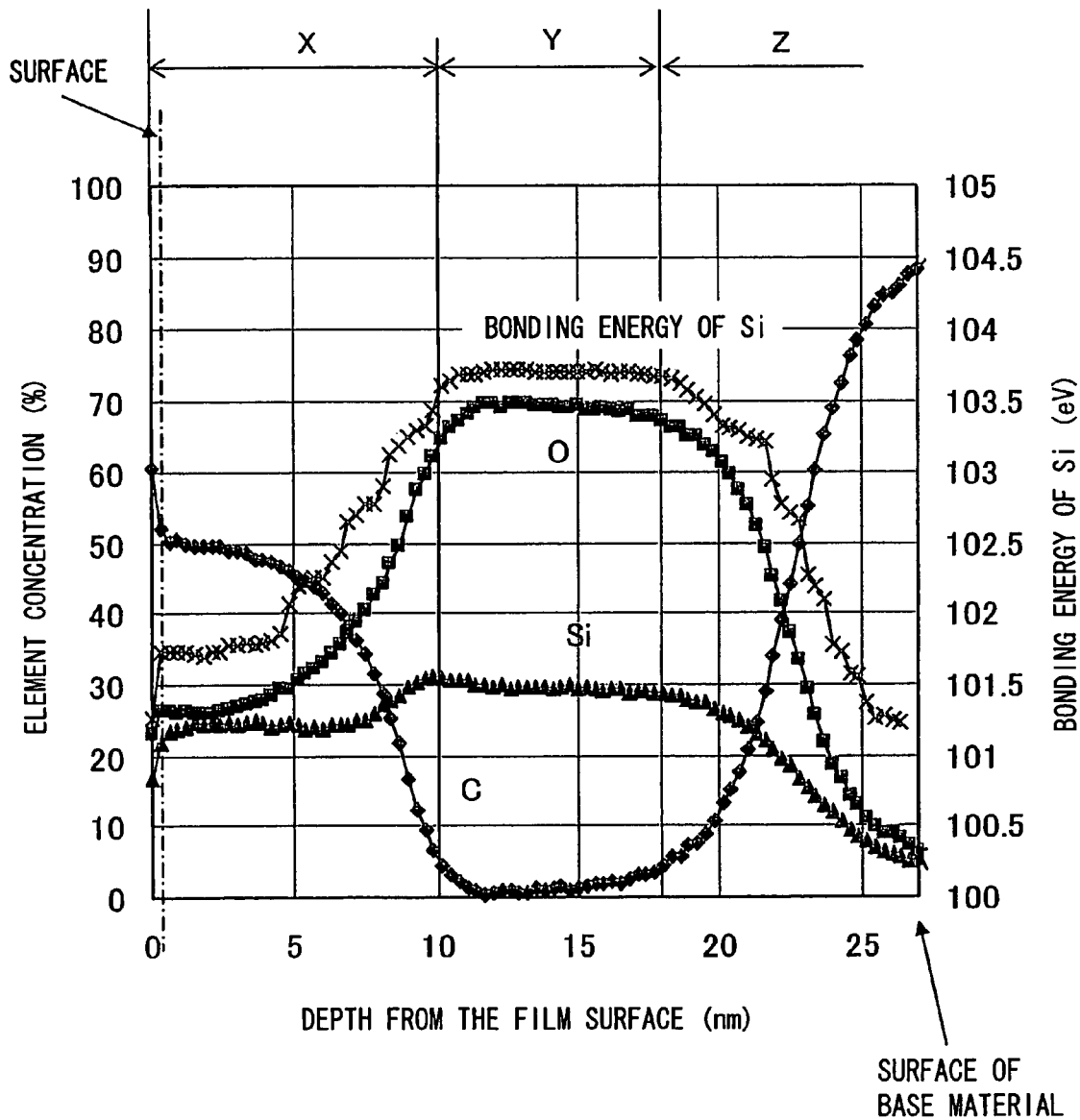
FIG. 1 is a diagram illustrating the element composition of a vapor deposited film of the invention formed in Example 1 in the direction of thickness thereof and bonding energy of silicon.

Reference should be made to FIG. 1 in the accompanying drawings. FIG. 1 schematically illustrates the element composition (M, O, C) of a vapor deposited film of the present invention (particularly, the one prepared in Example 1 appearing later) as measured by an X-ray photoelectron spectroscopic analysis, the vapor deposited film being sectionalized into three regions of a surface protection layer X, an intermediate barrier layer Y and an adhesive layer Z from the outer surface side toward the surface of the base material. That is, the vapor deposited film of the present invention is formed on the surface of a predetermined base material by a plasma CVD method by using an organic metal compound and an oxidizing gas as reaction gases, and in which a metal element (M), oxygen (O) and carbon (C) derived from the organic metal compound are distributed as shown in FIG. 1. The vapor deposited film is sectionalized into the above-mentioned three regions depending upon the element concentrations as expressed on the basis of the three elements. In FIG. 1, silicon (Si) is shown as the metal element (M).

In FIG. 1, the adhesive layer Z formed on the surface side of the base body is a region where the C concentration is not less than 5 element %. This region exhibits a high organic property and a high flexibility. That is, the layer of a metal oxide (which corresponds to an intermediate barrier layer described below) formed by the plasma CVD is highly inorganic and has a high oxygen-barrier property but lacks flexibility and poorly adheres to the base material. On the other hand, the highly organic adhesive layer is highly flexible and favorably adheres to the base material. Upon forming the highly organic adhesive layer Z on the surface of the base material, therefore, it is allowed to effectively avoid a decrease in the adhesiveness and in the close adhesion; i.e., a particularly high adhesiveness is exhibited to the plastic base material.

It is desired that the adhesive layer Z has a carbon concentration (C) which gradually increases toward the surface side of the base material and, particularly, that the carbon concentration (C) is increased to not less than 20 element % on the interfacial side to the surface of the base material from the standpoint of improving the adhesiveness to the base material. As will be obvious from FIG. 1, further, a gradual increase in the carbon concentration (C) toward the interfacial side to the surface of the base material is accompanied by a gradual decrease in the concentration of the metal element (M) and in the concentration of oxygen (O).

In the intermediate barrier layer Y formed on the above adhesive layer, further, the C concentration is less than 5 element %. In this region, therefore, the total concentration (M+O) of the metal element (M) and oxygen (O) is not less than 95 element %. That is, the layer Y formed in the central portion of the vapor deposited film is lowly organic, rich in inorganic property, and exhibits a high barrier property, particularly, against oxygen. When, for example, an organosilicon compound such as hexamethyldisiloxane (HMDSO) or the like is used as the organic metal compound, the intermediate barrier layer comprises chiefly a silicon oxide. Therefore, the vapor deposited film of the present invention is particularly useful in the field of packing materials such as plastic containers where barrier property is required against gases such as oxygen, carbonic acid gas or the like gases.

In the above intermediate barrier layer Y, the degree x of oxidation of the metal element (M) must satisfy the following condition, $$1.8 < x \leq 2.4$$

The degree x of oxidation is represented by the element ratio (O/M) of oxygen (O) to the metal element (M). When the degree x of oxidation is within the above range, the intermediate barrier layer exhibits a high gas-barrier property. When the degree x of oxidation lies outside the above range, the gas-barrier property decreases.

The surface protection layer X positioned on the front surface side of the vapor deposited film is a region where the carbon concentration is not less than 5 element %, containing carbon in large amounts and is rich in organic property like the adhesive layer Z described above. In the present invention, it is essential that the element concentrations, the degree x of oxidation of the metal element (M) and the bonding energy of the metal element (M) satisfy all of the following conditions (a) to (c) in the surface of the vapor deposited film in the surface protection layer X (concretely, at a position 0.3 nm deep from the outer surface):

Condition (a):
    The carbon (C) concentration is higher than the oxygen (O) concentration and the metal element (M) concentration, i.e., C>O and C>M;
Condition (b):
    The degree x of oxidation of the metal element (M) (i.e., element ratio O/M) is not larger than 1.3; and
Condition (c):
    The bonding energy of the metal element (M) is smaller than an average value of the bonding energy of the metal element of the intermediate barrier layer by not less than 1.0 eV.

That is, the above conditions are to represent that the surface of the vapor deposited film is rich in carbon and is very rich in organic property and upon satisfying all of the above conditions, the vapor deposited film exhibits very improved water resistance and effectively suppresses the metal element (M) from being eluted out, particularly, into the alkaline aqueous solution. If even one of these conditions is not satisfied, the water resistance becomes insufficient and the metal element (M) elutes out conspicuously into the alkaline aqueous solution. For example, as will be obvious from the experimental results of Example 1 and Comparative Example 1 appearing later, despite the conditions (a) and (c) are satisfied, if the degree x of oxidation of the metal element (M) in the surface is 1.49 which is in excess of 1.3 (condition (b) is not satisfied), the film decreases by an amount of 3.4 nm due to the elution of the metal element (Si) after the vapor deposited film is immersed in an alkaline aqueous solution for a predetermined period of time (Comparative Example 1). When the conditions (a) to (c) are all satisfied (Example 1), the film decreases by an amount of 0.2 nm from which it will be learned that the elution of the metal element (Si) is very suppressed. The vapor deposited film of the invention exhibits such an excellent water resistance probably because, upon satisfying all of the above conditions (a) to (c), there is present almost no oxygen atom (O) or OH group (silanol group) that becomes a factor for decreasing the water resistance in the surface of the vapor deposited film, since the oxygen atom or the OH group are covered with the surface protection layer of a sufficiently large thickness.

In the vapor deposited film of the present invention, further, it is desired that the above conditions (a) to (c) are satisfied in the surface of the vapor deposited film and, at the same time, the carbon (C) concentration gradually increases in the surface protection layer X toward the surface side as shown in FIG. 1 accompanied by a gradual decrease in the concentration of the metal element (M) such as Si and in the concentration of oxygen (O). It is desired that the carbon (C) concentration is increasing, for example, up to 40 element % or more and, particularly, that the region where the carbon (C) concentration is not less than 40 element % is present maintaining a thickness of not less than 5 nm. Upon forming the region of a very high carbon (C) concentration on the surface side as described above, it is allowed to cover the intermediate barrier layer Y that, has poor water resistance and permits the metal element (M) such as silicon (Si) or the like to easily elute out with the surface protection layer X of a sufficiently large thickness and to completely interrupt the permeation of water effectively avoiding a drop in the gas-barrier property caused by water.

In the present invention as will be understood from FIG. 1, the element concentrations are varying substantially continuously in the interfacial portions where the layers X, Y and Z are neighboring. That is, in these interfacial portions, the element concentrations are continuously and monotonously increasing or decreasing meaning that the layers X, Y and Z are integrally formed without forming distinct interfaces among the neighboring layers. Therefore, the vapor deposited film of the present invention does not peel off into the individual layers, and exhibits very excellent durability and stable barrier property against gases such as oxygen and the like and against water for extended periods of time.

In the vapor deposited film of the present invention as described above, the surface protection layer X, intermediate barrier layer Y and adhesive layer Z are not present in the form of distinct layers, and there is no clear interface, either, among the layers. Therefore, though it is not possible to critically define the thicknesses of the regions, it is desired that the vapor deposited film has a thickness (total thickness of the above regions) in a range of, usually, 4 to 500 nm, the intermediate barrier layer Y having a thickness of not smaller than about 4.0 nm, and the adhesive layer Z having a thickness of not smaller than about 0.2 nm.

In the present invention, further, it is desired to form rough the surface of the surface protection layer X in order to improve the barrier property against the water component. Upon adjusting the average surface roughness Ra (JIS B0601) to be, for example, about 0.1 to about 10.0 nm, the barrier property can be further improved against the water component. In forming the vapor deposited film, for example, the rough surface is formed by, for example, adjusting the degree of pressure reduction for glow discharge and conducting the glow discharge under a relatively high pressure.

In the present invention described above, it is very desired to form an organic/inorganic composite region that satisfies a predetermined condition in the adhesive layer Z from the standpoint of improving the heat resistance of the vapor deposited film.

Figure 12:
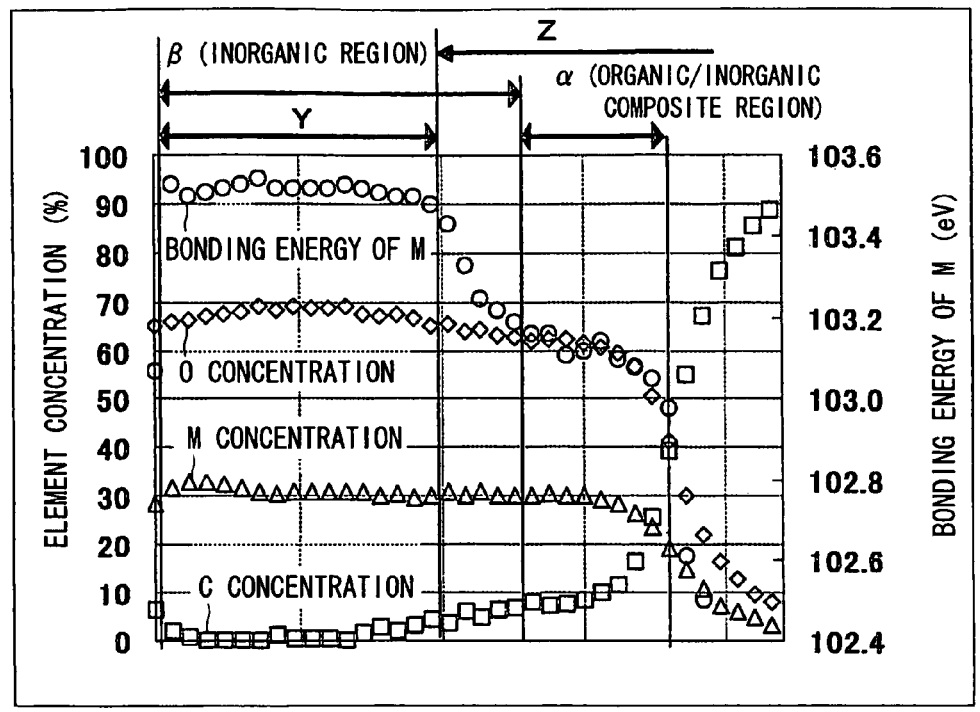
FIG. 12 is a diagram illustrating the element composition in the direction of thickness of the vapor deposited film of Experiment 3 and a bonding energy profile of the metal element (Si).

Reference should be made to FIG. 12 in the accompanying drawings. FIG. 12 illustrates the element composition (M, O, C) of the vapor deposited film (prepared in Experiment 3 described later) and the bonding energy of the metal element (M) as measured by an X-ray photoelectron spectroscopic analysis. For easy explanation of the function of the organic/inorganic composite region, the vapor deposited film does not show the surface protection layer X described above.

In the vapor deposited film of the invention as described earlier, the carbon concentration gradually decreases from the interfacial portion to the surface of the base plate toward the intermediate barrier layer Y accompanied by a gradual increase in the concentration of oxygen (O) and in the concentration of the metal (M). That is, the carbon-rich region gradually shifts into the metal-rich region. As shown in FIG. 12, therefore, an organic/inorganic composite region α having organic property as well as inorganic property is formed in the adhesive layer Z, an inorganic region β rich in inorganic property is formed on the outer surface side of the region α excluding the surface protection layer X on the outer surface side, and the above-mentioned intermediate barrier layer Y is present in the inorganic region β.

In the organic/inorganic composite region α of the present invention, the element ratio (C/M) and the element ratio (O/M) are satisfying the conditions of the following formulas (1) and (2):

$$0.2 < C/M < 1.8 \tag{1}$$

$$1.5 \leq O/M \tag{2}$$

That is, if compared to the inorganic region β (C/M≦0.2) including the above intermediate barrier layer Y, the organic/inorganic composite region α may have a degree of oxidation (O/M) of the metal element (M) which is slightly small but contains carbon (C) in large amounts (C/M) relative to the metal element (M). That is, though not so conspicuous as the region comprising chiefly carbon near the surface of the base material, the organic/inorganic composite region α is richer in organic property than the inorganic region β, and exhibits both organic property and inorganic property.

In the organic/inorganic composite region α, further, the bonding energy of the metal element (M) is in a range lower by 0.1 eV to 0.7 eV than an average value of the bonding energy of the metal element (M) in the intermediate barrier layer Y. Here, a value obtained by subtracting the bonding energy of the metal element (M) in the organic/inorganic composite region α from the average value of the bonding energy of the metal element (M) in the intermediate barrier layer Y, is called "a difference ($\Delta M$) in the bonding energy from the intermediate barrier layer". That is, the bonding energy between the metal element (M) and oxygen (O) is larger than the bonding energy between the metal element (M) and carbon (C). In the organic/inorganic composite region α containing carbon (C) in an amount larger than in the inorganic region β, therefore, the bonding energy of the metal element (M) assumes a value smaller than that in the inorganic region β. In the present invention, however, the metal oxide having a high degree of oxidation is contained in the organic/inorganic composite region α to a degree until the difference ($\Delta M$) in the bonding energy lies within the above-mentioned range.

As described earlier, the intermediate barrier layer Y in the inorganic region β exhibits a high gas-barrier property but has a defect of lacking flexibility and lacking adhesiveness to the base material. For example, in case the base material is deformed to some extent due to expansion or the like, the inorganic region β can no longer follow the change in the base material. As a result, adhesion to the base material is impaired and the gas-barrier property decreases. Such an inconvenience can be avoided by forming the above-mentioned adhesive layer Z rich in flexibility. According to the present invention, the organic/inorganic composite region α satisfying the above condition is formed in the adhesive layer Z to achieve unexpected advantage in that the adhesion of the adhesive layer to the base material is enhanced without impairing the flexibility while, astonishingly, improving heat resistance of the vapor deposited film.

With the vapor deposited film disclosed in, for example, the patent document 3, the region formed on the surface on the side of the base plate has a very high carbon concentration, has a difference in the bonding energy ($\Delta M$) from the gas-barrier layer in a range in excess of 0.7 eV, and does not exhibit inorganic property. Therefore, the vapor deposited film has a high degree of flexibility and exhibits excellent adhesiveness to the base material accompanied, however, by a problem of low heat resistance. As demonstrated in Comparative Experiment 1 appearing later, if the above vapor deposited film is formed on the inner surface of a PET bottle, the metal element (silicon) elutes out in a greatly increased amount into the solution when the bottle is filled with the hot solution as compared to when the bottle is filled with the solution of room temperature. On the other hand, if the vapor deposited film having the organic/inorganic composite region α satisfying the above conditions formed in the adhesive layer is formed on the inner surface of the PET bottle (Experiment 1), a very high heat resistance is exhibited. Therefore, even when the PET bottle is filled with the hot solution, the metal element (silicon) elutes out in amounts nearly equal to when the PET bottle is filled with the solution at room temperature, i.e., the metal element (silicon) elutes out in very small amounts.

Concerning the reason why the heat resistance is improved by the formation of the organic/inorganic composite region α, the present inventors presume as described below. That is, with the vapor deposited film in which an organic region (adhesive layer) containing much carbon is simply formed on the side of the base plate as in the patent document 3, the organic region is becoming active due to the hot filling or preservation at a high temperature. In a hot state, therefore, the metal element (M) easily liberates from the inorganic region (or the intermediate barrier layer) formed on the organic region, and elutes out, for example, into the solution in the bottle. In the organic/inorganic composite region α present in the adhesive layer of the present invention, on the other hand, the metal element (M) of a certain amount is present in a form having a high degree of oxidation. Therefore, the activity of the organic/inorganic composite region α at high temperatures is considerably smaller than that in the organic region, though the activity thereof is lower than that in the inorganic region β (or the intermediate barrier layer Y). Therefore, the metal element (M) is little liberated even at high temperatures and, as a result, excellent heat resistance is obtained.

In the above-mentioned vapor deposited film of the present invention as shown in FIG. 12, it is desired that in the organic/inorganic composite region α, the bonding energy of the metal element (M) gradually increases from the side of the base body toward the inorganic region β and that a difference between a maximum value and a minimum value of the bonding energy of the metal element (M) is not less than 0.1 eV. Upon satisfying the above conditions, it is allowed to maintain the organic/inorganic composite region α in a suitable thickness (e.g., about 0.2 to about 10 nm) and to obtain a high degree of adhesion to the base member relying upon its flexibility. A clear interface is not formed, either, between the region α and the region β. Therefore, the two regions do not peel at the interface thereof, and the film exhibits very excellent durability and stable gas-barrier property against gases such as oxygen and the like and water component for extended periods of time.

In the above-mentioned organic/inorganic composite region α of the present invention, the element ratio (C/M) and the element ratio (O/M) may satisfy the conditions of the following formulas (1a) and (2a):

$$1.0 < C/M < 1.8 \quad (1a)$$

$$2.0 \leq O/M \quad (2a)$$

In the above region, carbon (C) is contained in an amount slightly larger than the amount of the metal element (M), and the degree of oxidation (O/M) of the metal element (M) is at a high level. That is, upon forming the organic/inorganic composite region α having organic property at a relatively high level and containing a metal oxide of a high degree of oxidation, it is allowed to improve the effect for holding adhesion relying upon the flexibility and the effect for enhancing the heat resistance. It is very desired to form the above organic/inorganic composite region α from the standpoint of expressing the effect for maintaining desired adhesiveness and the effect for improving the heat resistance despite the organic/inorganic composite region α is formed maintaining a thickness as small as about 0.2 to about 5.0 nm.

[Base Material]

In the present invention, the base material on which the film is to be formed by vapor deposition may be the one made of a glass or various metals but, most desirably, is a plastic base member. As the plastic material, there can be used known thermoplastic resins such as polyolefins as represented by random or block copolymers of α-olefins, like low-density polyethylene, high-density polyethylene, polypropylene, poly 1-butene, poly 4-methyl-1-pentene or ethylene, propylene, 1-butene and 4-methyl-1-pentene; cyclic olefin copolymers; ethylene/vinyl compound copolymers such as ethylene/vinyl acetate copolymer, ethylene/vinyl alcohol copolymer and ethylene/vinyl chloride copolymer; styrene resins such as polystyrene, acrylonitrile/styrene copolymer, ABS and α-methylstyrene/styrene copolymer; polyvinyl compounds such as polyvinyl chloride, polyvinylidene chloride, vinyl chloride/vinylidene chloride copolymer, methyl polyacrylate and methyl polymethacrylate; polyamides such as nylon 6, nylon 6-6, nylon 6-10, nylon 11 and nylon 12; thermoplastic polyesters such as polyethylene terephthalate, polybutylene terephthalate and polyethylene naphthalate; polycarbonates; polyphenylene oxides; and biodegradable resins such as polylactic acid, or a mixture thereof.

These base materials can be used in the form of a film or a sheet, or can be used in the form of a container such as bottle, cup, tube or the like, or in the form of any other formed article. As the bottle, in particular, there can be exemplified a biaxially draw-blow-formed bottle made from a polyester such as polyethylene terephthalate. The invention can be similarly applied to the polyester cup or the biaxially drawn film, as a matter of course.

Further, the plastic base material may be a multi-layer gas-barrier structure using the thermoplastic resin (preferably, olefinic resin) as inner and outer layers, and having an oxygen-absorbing layer formed between the inner and outer layers. Upon forming the vapor deposited film of the present invention on the surfaces of the inner layer and/or the outer layer of the multi-layer structure, it is made possible to markedly improve the oxygen-barrier property.

[Reaction Gases]

In the present invention, an organic metal compound and an oxidizing gas are used as reaction gases. As required, however, a hydrocarbon that serves as a carbon source can be also used in combination.

In the present invention, an organic silicon compound is preferably used as the organic metal compound. Not being limited to the organic silicon compound, however, there can be further used various organic aluminum compounds such as trialkylaluminum or any other organic titanium compounds provided they are capable of forming metal oxides upon reacting with the oxidizing gas. As the organic silicon compound, there can be used organic silane compounds such as hexamethyldisilane, vinyltrimethylsilane, methylsilane, dimethylsilane, trimethylsilane, diethylsilane, propylsilane, phenylsilane, methyltriethoxysilane, vinyltriethoxysilane, vinyltrimethoxysilane, tetramethoxysilane, tetraethoxysilane, phenyltrimethoxysilane, methyltrimethoxysilane and methyltriethoxysilane; and organic siloxane compounds such as octamethylcyclotetrasiloxane, 1,1,3,3-tetramethyldisiloxane and hexamethyldisiloxane. There can be further used aminosilane and silazane in addition to the above materials.

The above organic metal can be used in a single kind or in a combination of two or more kinds. It is, further, allowable to use the silane ($SiH_4$) or the silicon tetrachloride in combination with the above organic silicon compound.

Oxygen or NOx is used as the oxidizing gas, and argon or helium is used as the carrier gas.

As the carbon source, there can be used an organic silicon compound or an organic metal compound, as well as a hydrocarbon $CH_4$, $C_2H_4$, $C_2H_6$ or $C_3H_8$.

[Forming the Vapor Deposited Film]

In the present invention, a vapor deposited film is formed on the surface of the base material by a plasma CVD method in an atmosphere containing the above-mentioned reaction gases.

The plasma CVD is for growing a thin film by utilizing a gaseous plasma, and basically comprises a process of deposition on a base material by decomposing a gas containing a starting gas with the electric discharge using electric energy in a high electric field under a reduced pressure, and depositing the formed substance on the base material through the chemical reaction in the gaseous phase or on the base material. The state of plasma is realized by a glow discharge. There have been known a method that utilizes a DC glow discharge, a method that utilizes a high-frequency glow discharge and a method that utilizes a microwave discharge depending upon the method of glow discharge.

The low-temperature plasma CVD has such advantages that:

a. Since gaseous molecules are directly decomposed by high-speed electrons, the starting gas having a large forming energy can be easily dissociated;

b. The electron temperature and the gaseous ion temperature are different from each other establishing a thermally non-equilibrium state in which the electron temperature is high having energy necessary for executing the chemical reaction while the ion temperature is low, making it possible to execute the processing at a low temperature; and c. A relatively homogeneous amorphous film can be formed despite the base plate temperature is low.

Accordingly, the low-temperature plasma CVD method can be easily applied to even forming a film on the plastic base material by vapor deposition.

According to the present invention, the vapor deposited film must be so formed that the regions are formed as shown in FIG. 1 as described above. As such means, there can be exemplified adjustment relying on the reaction gases and adjustment of output of glow discharge.

When the reaction gases are relied upon, for example, the oxidizing gas may be fed in an amount smaller than that of the organic metal compound. In this case, the level of decomposing the organic metal compound by oxidation is low, and a polymer is formed. As a result, it is allowed to form a region where the amount of carbon is large, e.g., to form the surface protection layer X and the adhesive layer Z. By feeding the oxidizing gas in an amount larger than that of the organic metal compound, further, the organic metal compound is decomposed by oxidation to a high level, and a nearly perfect metal oxide is formed. As a result, there is formed a region where the amount of carbon is small, i.e., there is formed an intermediate barrier layer Y. Further, a hydrocarbon that serves as a carbon source can be fed to form the surface protection layer X.

Further, when the layers X to Z are to be formed by adjusting the reaction gases, attention must be given to balancing the output of the microwaves and the amount of feeding oxygen so that the element concentrations vary continuously without forming interfaces among the regions.

In the case of adjusting the output of the glow discharge, there can be formed the surface protection layer X and the adhesive layer Z containing carbon in large amounts if, for example, glow discharge for producing the plasma is generated with a low output, and the intermediate barrier layer Y containing carbon in small amounts can be formed if the glow discharge is generated with a high output.

The method based on a change of output utilizes the following principle.

If, for example, the organic silicon oxide is described, it is considered that the silicon oxide film is formed due to the organic silicon compound and the oxidizing gas through the following reaction paths:

(a) Abstraction of hydrogen: $SiCH_3 \rightarrow SiCH_2$ (b) Oxidation: $SiCH_2 \rightarrow SiOH$ (c) Dehydrating condensation: $SiOH \rightarrow SiO$ That is, if the glow discharge is executed with a high output, e.g., with an output of 100 W or more, the organic silicon compound reacts up to the step (c) at one time. As a result, the intermediate barrier layer Y is formed having a high level of decomposition by oxidation and containing carbon in small amounts. On the other hand, if the glow discharge is executed with a low output, e.g., about 20 to about 80 W, radicals $SiCH_2$ formed at the step (a) react with one another forming an organic silicon compound polymer. As a result, there are formed the surface protection layer X and the adhesive layer Z containing carbon in large amounts.

Further, when the layers X to Z are to be formed by adjusting the output of glow discharge, it is necessary to continuously vary the adjustment of glow discharge output, so that the element concentrations vary continuously without forming interfaces among the regions.

In the present invention, the glow discharge for producing the plasma is generated in a high-frequency electric field or in a microwave electric field. When the base material to be treated is a plastic material, it is desired that the glow discharge is generated in the high-frequency electric field with the output in the high-output range of not less than 100 W though the optimum conditions vary depending upon the distance between the electrodes and cannot be exclusively specified. When the glow discharge is to be generated in the microwave electric field, it is desired that the output of the glow discharge is in the high-output range of not less than 90 W.

For example, to form the vapor deposited film satisfying the above-mentioned conditions (a) to (c) realizing the carbon (C) concentration profile in the surface protection layer X as shown in FIG. 1, it is desired to form the intermediate barrier layer Y of a thickness which is large to some extent, discontinue the supply of the reaction gas, purge the atmosphere with the gas of an organic metal compound and, thereafter, start the glow discharge. If the glow discharge is executed in a state where the reaction gas is present, the degree x of oxidation becomes greater than, for example, 1.3 in the surface, and the water resistance of the vapor deposited film may decrease.

In the present invention, further, means based on the amount of feeding the reaction gases is combined with means based on the glow discharge output to form the organic/inorganic composite region α in the adhesive layer and to form, on the region α, the inorganic region β which includes the intermediate barrier layer Y.

Referring, for example, to a case of forming the vapor deposited film by using hexamethyldisiloxane (HMDSO), the film is formed by depositing vapor relying on the plasma reaction with a low output while feeding the HMDSO and the oxidizing gas in amounts at a ratio $O_2$/HMDSO (mol ratio) of about 8 to about 12, and the output is gradually increased to form the vapor deposited film having the organic/inorganic composite region α formed in the adhesive layer Z. When the microwaves are used, the glow discharge starts at about 30 W. The output is gradually increased and when the output becomes not less than 90 W, the intermediate barrier layer Y containing the metal element (Si) oxidized to the highest degree and containing substantially no carbon (C) is formed in the inorganic region β on the organic/inorganic composite region α. When the high frequencies are used, though the optimum conditions vary depending upon the distance between the electrodes and cannot be exclusively specified, the glow discharge usually starts at about 40 W. The output is gradually increased and when the output finally becomes not less than 100 W, the intermediate barrier layer Y can be formed in the inorganic region β.

When either the microwaves or the high frequencies are used, the gradient of output and the film-forming time are adjusted, so that the organic/inorganic composite region α satisfies the above formulas (1) and (2) or satisfies the conditions of the formulas (1a) and (2a). For example, the gradient of output is relatively loosened or the film-forming time is lengthened, so that the organic/inorganic composite region α satisfies the above-mentioned formulas (1) and (2) and that the thickness thereof becomes about 0.2 to about 10 nm. Further, by rendering the gradient of output to become relatively sharp and the film-forming time to be shortened, the organic/inorganic composite region α can be formed satisfying the formulas (1a) and (2a) and having a thickness of about 0.2 to about 5.0 nm. However, if the gradient of output is rendered to be unnecessarily sharp or the film-forming time is set to be very short, the organic/inorganic composite region α possesses a small thickness and readily shifts into the inorganic region β. Therefore, the gradient of output and the film-forming time should be so adjusted that the region α assumes the thickness of at least about 0.2 nm.

[Treating Apparatus]

Figure 2:
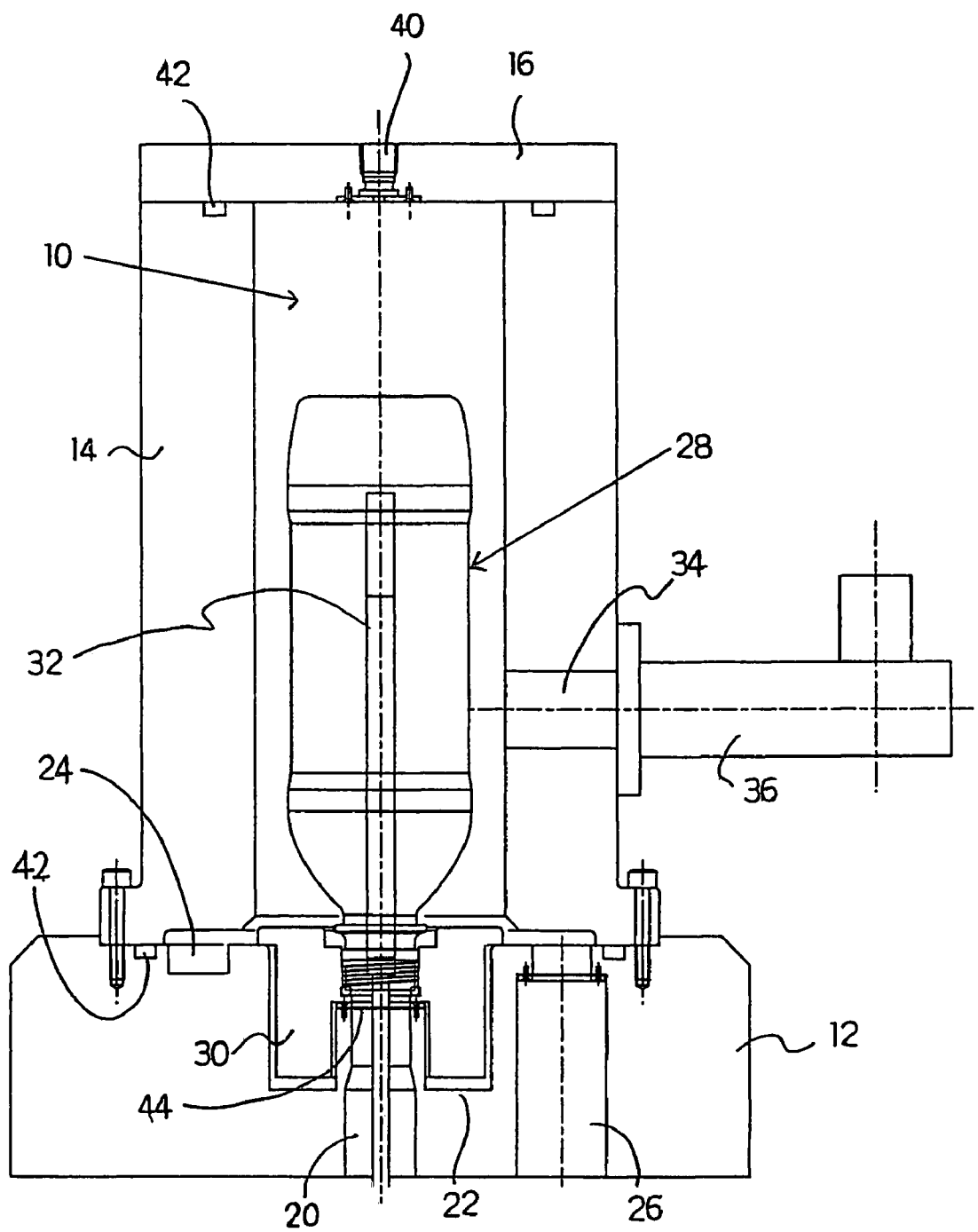
FIG. 2 is a diagram illustrating the structure of a plasma-treating apparatus for forming the vapor deposited film of the present invention.

According to the present invention, the apparatus used for forming the vapor deposited film includes a plasma-treating chamber which holds a base material to be treated, an exhaust system for maintaining the plasma-treating chamber in a state of a reduced pressure, a treating gas introduction system for introducing the treating gas into the plasma-treating chamber, and an electromagnetic wave introduction system for producing plasma in the plasma-treating chamber. FIG. 2 illustrates the structure of the above apparatus which is an example of the microwave plasma-treating apparatus.

In FIG. 2, the plasma-treating chamber generally designated at 10 is constituted by an annular base plate 12, a cylindrical side wall 14, and a top lid 16 closing the upper portion of the cylindrical side wall 14.

A first exhaust hole 20 is formed in the central portion of the annular base plate 12, an annular recessed portion 22 is formed in the upper surface of the base plate 12 so as to surround the first exhaust hole 20, and an annular groove 24 is formed surrounding the annular recessed portion 22, the annular groove 24 being communicated with a second exhaust hole 26.

The annular recessed portion 22 holds a bottle holder 30 holding a bottle 28 in an inverted state. As will be obvious from FIG. 2, the bottle 28 in the inverted state is fitted at its neck portion to the bottle holder 30. The neck portion of the bottle 28 held by the holder is communicated with the first exhaust hole 20, and a gas feed pipe 32 is inserted in the bottle 28 from the first exhaust hole 20 through the neck portion of the bottle 28.

The cylindrical side wall 14 is provided with a microwave introduction port 34, and a microwave transmission member 36 such as a waveguide or a coaxial cable is connected to the microwave introduction port 34. That is, microwaves are introduced from a predetermined microwave oscillator into the plasma-treating chamber 10 through the microwave transmission member 36.

The top lid 16 is provided with a cooling gas feed port 40. After the film has been formed by vapor deposition or while the film is being formed by vapor deposition, therefore, the cooling gas is blown to the bottom portion of the bottle 28 which is held in the inverted state in the plasma-treating chamber 10 to effect the cooling.

To maintain the sealing of the plasma-treating chamber 10, further, O-rings 42 are provided in the interface between the base plate 12 and the cylindrical side wall 14 and in the interface between the cylindrical side wall 14 and the top lid 16. The bottle holder 30, too, is provided with an O-ring 42 for shutting off the interior from the exterior of the bottle 28.

Further, the first exhaust hole 20 and the second exhaust hole 26 formed in the base plate 12 are provided with shields 44 for confining the microwaves. The base plate 12, cylindrical side wall 14 and top lid 16 are all made of metals to confine the microwaves.

To form the vapor deposited film by the treatment with plasma, first, the bottle holder 30 holding the bottle 28 in the inverted state is placed in the annular recessed portion 22 of the base plate 12. In this state, the base plate 12 is lifted by using a suitable lift until it comes in contact with the cylindrical side wall 14 thereby to constitute the plasma-treating chamber 10 which is closed and is holding the bottle 28 in the inverted state as shown in FIG. 2.

Next, the gas feed pipe 32 is inserted in the bottle 28 from the first exhaust hole 20, a vacuum pump is driven, and the interior of the bottle 28 is maintained in a vacuum state being evacuated from the first exhaust hole 20. Here, to prevent the bottle 28 from being deformed by the external pressure, the pressure in the plasma-treating chamber 10 in the exterior of the bottle 28 is reduced by the vacuum pump through the second exhaust hole 26.

The degree of pressure reduction in the bottle 28 is so high that a glow discharge takes place when a treating gas is introduced from the gas feed pipe 32 and the microwaves are introduced therein, and is, desirably, in a range of, for example, 1 to 500 Pa and, particularly desirably, 5 to 50 Pa.

On the other hand, the degree of pressure reduction in the plasma-treating chamber 10 in the exterior of the bottle 28 is such that no glow discharge occurs despite the microwaves are introduced.

After the pressure has been reduced, the reaction gas is introduced into the bottle 28 from the gas feed pipe 32, and microwaves are introduced into the plasma-treating chamber 10 through the microwave transmission member 36 to produce a plasma by glow discharge. The electron temperature in the plasma is several tens of thousands of degrees Kelvin, which is higher by about hundreds of times than the temperature of gaseous particles, which is several hundreds of degrees Kelvin, creating a thermally non-equilibrium state making it possible to execute the plasma treatment even for the plastic base materials of low temperatures.

The above-mentioned reaction gas or the microwave output for glow discharge is adjusted as described earlier, and the film formed by vapor deposition includes the adhesive layer Z, intermediate barrier layer Y and surface protection layer X in this order from the inner surface of the bottle, and its element composition is as shown in FIG. 1 as measured by the X-ray photoelectron spectroscopic analysis. In the final step, the pressure in the bottle 28 is elevated to a degree of about 15 to about 500 Pa to roughen the surface (i.e., surface of the vapor deposited film) of the surface protection layer X and to enhance the shut-off property against water.

After the predetermined plasma treatment has been finished, the treating gas and the microwaves are no longer introduced, the cooling gas is introduced from a cooling gas feed hole 40, the pressures inside and outside the bottle 28 are returned back to normal pressure, and the bottle 28 treated with the plasma is taken out of the plasma-treating chamber 10 to thereby obtain a plastic bottle on which the film is vapor deposited as desired.

The time for the plasma treatment varies depending upon the inner surface area of the bottle to be treated, thickness of the film to be formed and the kind of the treating gas and cannot be exclusively specified, but is not shorter than one second per a 2-litter plastic bottle from the standpoint of stability in the plasma treatment and may, as required, be of the order of minutes though it is desired to shorten the time from the viewpoint of cost.

EXAMPLES

The invention will now be described by way of Examples. However, it should be noted that the invention is in no way limited to these Examples only.

1. Analysis of Composition in the Film.

The inner surface of the bottle body portion coated with the vapor deposited film was measured for its composition profiles of silicon, oxygen and carbon in the direction of depth of the film and for the bonding energy of silicon by using an X-ray photoelectron spectroscopic analyzing apparatus (Quantum 2000) manufactured by PHI Co.

The silicon concentration and the oxygen concentration were corrected on the basis of the molten quartz ($SiO_2$), and the film thickness was estimated relying on the rate of sputtering like that for the molten quarts ($SiO_2$) for convenience.

The element concentrations and the bonding energy of silicon in the surface of the vapor deposited film were measured at an acceleration voltage of 2 kV, a sputtering range of 3 mm×3 mm and at a position 0.3 nm deep from the surface of the film.

2. Evaluation of Alkali Resistance of the Vapor Deposited Film.

A PET bottle coated on its inner surfaces with the vapor deposited film was filled with 500 ml of an alkaline solution (mineral water, pH 7.3 placed in the market) at room temperature, sealed at its mouth portion with a polypropylene cap, preserved in an environment of 55° C. and 30% RH for 28 days, and was measured for the amount of silicon in the film by using an X-ray fluorometric analyzer (ZSX, manufactured by Rigaku Co.), which was compared with the amount of silicon in the bottle produced under the same conditions but before preserved to thereby evaluate the alkali resistance of the vapor deposited film based on the amount of reduction in the amount of silicon. Each bottle was measured at six positions in the direction of height, and an average value of the amount of silicon was regarded to be the film thickness.

3. Evaluation of Heat Resistance.

PET bottles coated on its inner surfaces with the vapor deposited film were filled with 500 ml of distilled water of 23° C. or 87° C., preserved in an environment of 55° C. for 28 days, and were measured for the amounts of silicon in the solutions in the PET bottles by using an induction-coupled plasma mass analyzer to thereby evaluate the heat resistance based on the amounts of silicon eluted into the solutions of high temperatures.

4. Evaluation of Adhesiveness.

2.5 Grams of the dry ice was introduced into the PET bottle coated on its inner surfaces with the vapor deposited film, closed by using a plastic cap, and was preserved in an environment of 55° C. for 2 days.

An expansion rate of the PET bottle ($V2/V1\times100$) was found from a volume (V1) of the PET bottle of before preserved and from a volume (V2) of the PET bottle after preserved. As a result, the volume has expanded to 102% after the preservation. By using an oxygen permeation amount measuring apparatus (OX-TRAN, manufactured by Modern Control Co.), the amounts of oxygen that has permeated (in an atmosphere of 37° C., 100% RH) were measured before the PET bottle was expanded and after the PET bottle was expanded to evaluate the adhesiveness as a change in the amount of oxygen that has permeated due to expansion of the PET bottle.

Example 1

An apparatus shown in FIG. 2 was used having a microwave power source of a frequency of 2.45 GHz and a maximum output of 1.2 kW, a cylindrical plasma-treating chamber made of a metal having a diameter of 90 mm and a height of 500 mm, a hydraulic rotary vacuum pump for evacuating the treating chamber, and a rectangular waveguide for introducing the microwaves into the plasma-treating chamber from an oscillator.

As the gas feed pipe, a sintered stainless steel gas feed pipe having a porous structure of an outer diameter of 15 mm and a length of 150 mm was used, a cylindrical bottle (PET bottle) made from a polyethylene terephthalate having a mouth diameter of 28 mm, a diameter of 64 mm, a height of 206 mm and a volume of 520 ml was placed on the bottle holder, and a degree of vacuum in the treating chamber in the exterior of the bottle was set to be 7 kPa and the degree of vacuum in the bottle was set to be 10 Pa.

In this state, into the bottle were introduced 2.7 sccm of a hexamethyldisiloxane (HMDSO) and 27 sccm of oxygen. Thereafter, microwave pulses of 500 W were oscillated from the microwave oscillator to conduct the treatment with plasma. Here, the time for oscillating the microwaves was varied to form the vapor deposited film comprising the adhesive layer Z and the intermediate barrier layer Y. Thereafter, the supply of oxygen gas was discontinued, the interior of the bottle was substituted with the HMDSO atmosphere, and the surface protection layer X was formed. The times for forming the layers by vapor deposition were 3 seconds (layer Z), 5 seconds (layer Y) and 3 seconds (layer X).

After the surface protection layer X was formed, the atmosphere was released to the open air to complete the formation of the vapor deposited film.

The vapor deposited film was measured for its composition profiles of silicon, oxygen and carbon in the direction of depth of the film and the bonding energy of Si as shown in FIG. 1. Table 1 further shows the element concentrations, degree x of oxidation and bonding energy of silicon in the surface of the vapor deposited film, average bonding energy of silicon and average degree x of oxidation (element ratio O/Si) in the intermediate barrier layer Y together with the evaluated results of alkali resistance (amount of decrease of the film).

Comparative Example 1

The treatment with plasma was conducted by the same method as that of Example 1 to form a vapor deposited film comprising the adhesive layer Z and the intermediate barrier layer Y. Thereafter, the supply of the oxygen gas was discontinued and, immediately thereafter, a treatment was conducted for forming the surface protection layer X for 0.5 seconds. Next, the atmosphere was released to the open air to complete the formation of the vapor deposited film.

Figure 3:
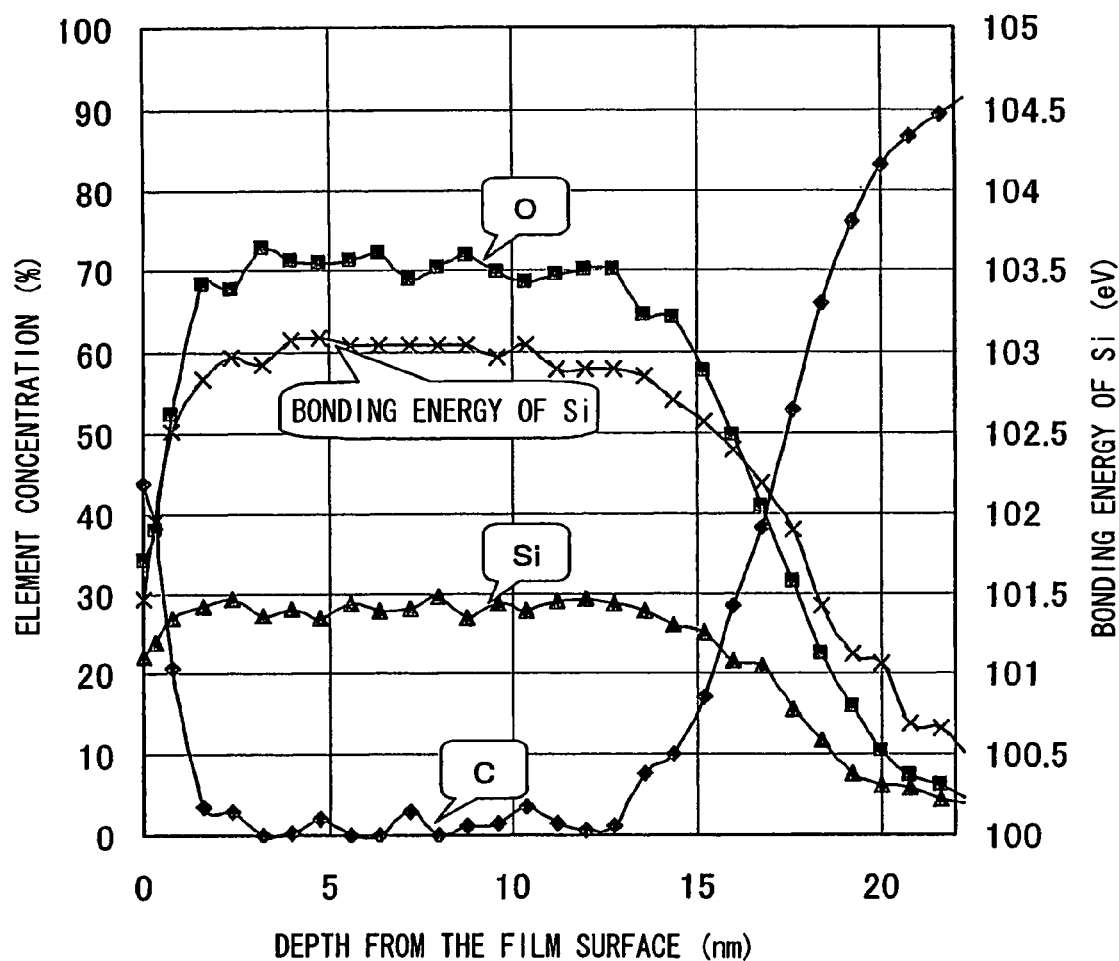
FIG. 3 is a diagram illustrating the element composition of a vapor deposited film formed in Comparative Example 1 in the direction of thickness thereof and bonding energy of silicon.

FIG. 3 shows the composition profiles of silicon, oxygen and carbon in the vapor deposited film in the direction of depth of the film and the bonding energy of silicon, and Table 1 shows the element concentrations and the evaluated result of alkali resistance in the surface of the vapor deposited film.

Comparative Example 2

A film was formed by vapor deposition in the same manner as in Example 1 but feeding 2.7 sccm of oxygen at the time of forming the surface protection layer X, and was analyzed and evaluated in the same manner as in Example 1. The results were as shown in Table 1.

Comparative Example 3

A film was formed by vapor deposition in the same manner as in Example 1 but without forming the surface protection layer X, and was analyzed and evaluated in the same manner as in Example 1. The results were as shown in Table 1.

From the above results, it is learned that the vapor deposited films of Examples satisfying all of the above conditions (a) to (c) exhibit good resistance against alkalis.

Figure 4:
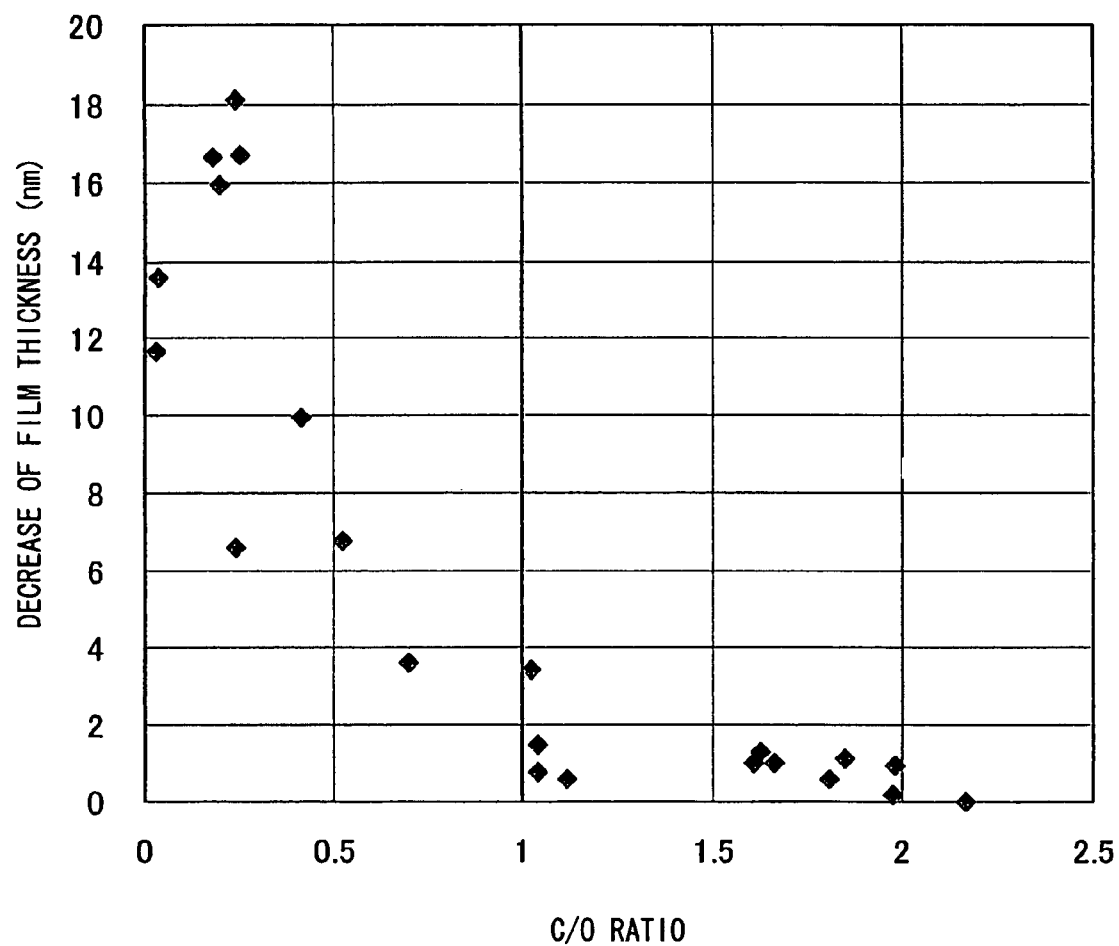
FIG. 4 is a diagram illustrating a relationship between the C/O ratio in the surface of the vapor deposited film and the amount of decrease in the film thickness.
Figure 5:
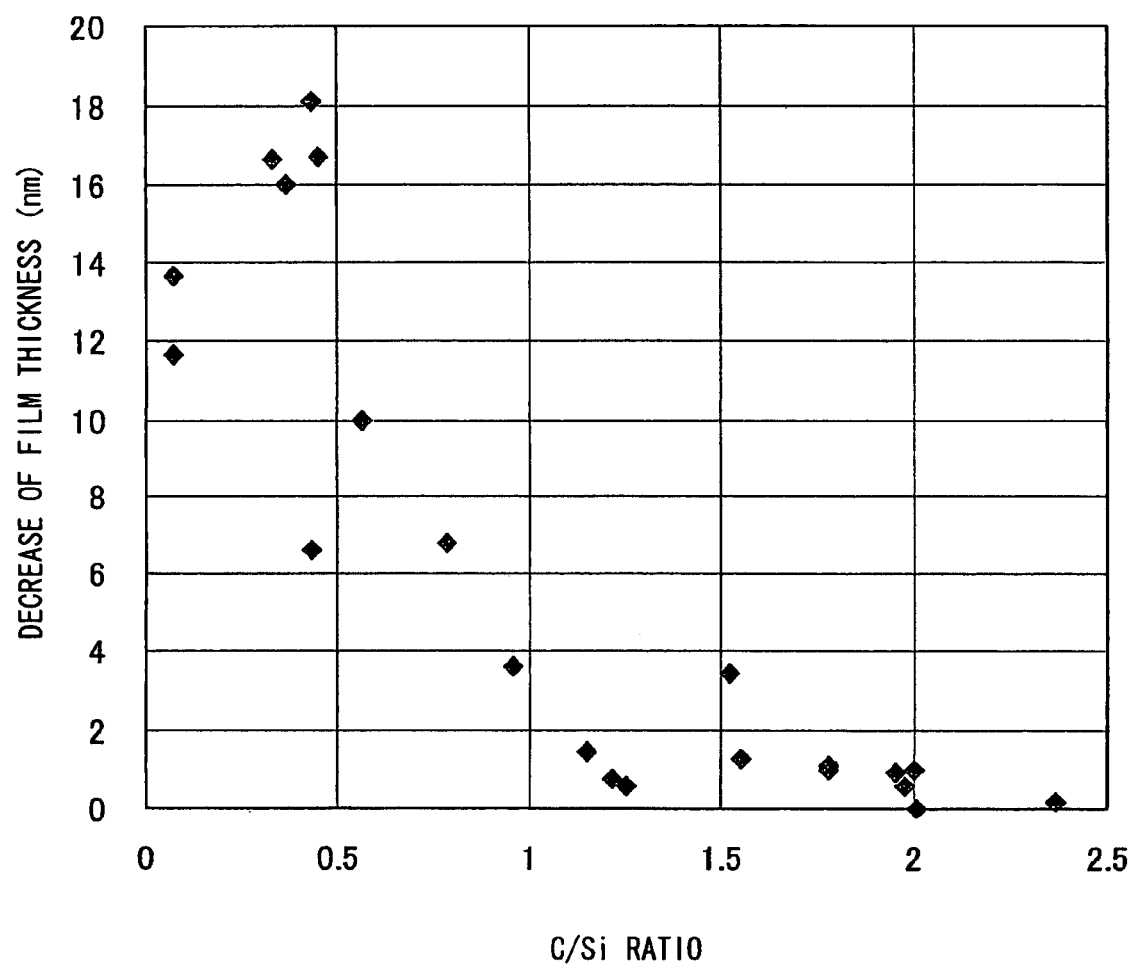
FIG. 5 is a diagram illustrating a relationship between the C/Si ratio in the surface of the vapor deposited film and the amount of decrease in the film thickness.
Figure 6:
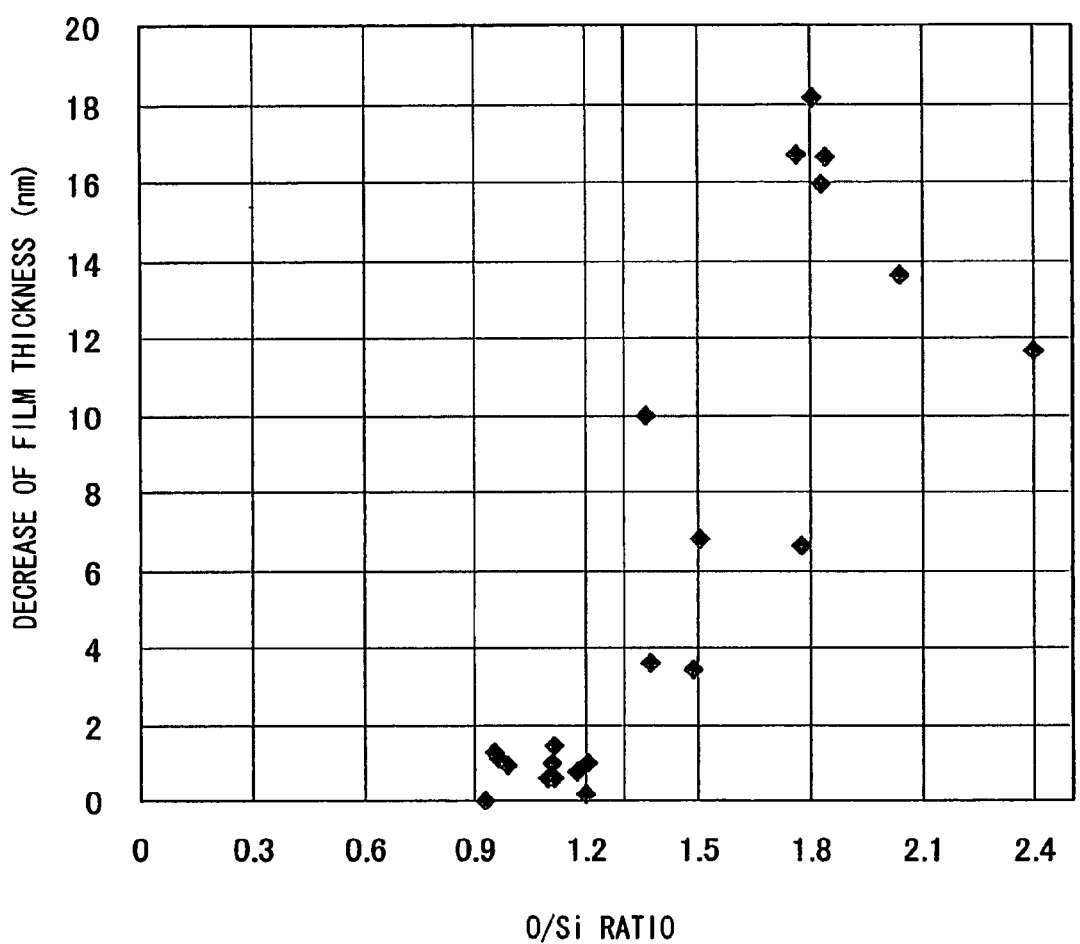
FIG. 6 is a diagram illustrating a relationship between the O/Si ratio (degree of oxidation) in the surface of the vapor deposited film and the amount of decrease in the film thickness.

FIGS. 4 to 6 illustrate relationships between the concentration ratios in the outer surfaces of the bottles produced under various conditions and the reduction of the films. From these results, it is confirmed that the favorable effect of surface protection and favorable resistance against alkalis are obtained when the element concentrations satisfy C>O, C>Si and the degree x of oxidation is not larger than 1.3 in the outer surface.

The following Experiments and Comparative Experiments were conducted in order to examine changes in the heat resistance and in the adhesiveness when the organic/inorganic composite region α was formed in the adhesive layer X.

In these experiments, the surface protection layer which is the outermost layer was omitted. In Experiments 1, 2 and in Comparative Experiments 1, 2, further, the organic/inorganic composite region α was regarded to be the region where the element ratio (C/Si) was in a range of 1.0 to 1.8. In Experiment 3, the organic/inorganic composite region α was regarded to be the region where the element ratio (C/Si) was in a range of 0.2 to 1.8.

Experiment 1

The plasma-treating apparatus and the PET bottle quite the same as those of Example 1 were used, the pressure in the treating chamber in the exterior of the bottle was set to be 7 kPa, the pressure in the bottle was set to be 10 Pa, 2.7 sccm of the hexamethyldisoloxane (HMDSO) and 27 sccm of oxygen were introduced therein, and microwave pulses were oscillated by using a microwave oscillator to conduct the treatment with plasma. While conducting the treatment with plasma, the intensity of the microwaves was varied to form an organic/inorganic composite region α and to form, thereon, an inorganic region β containing a gas-barrier film therein. Next, the atmosphere was released to the open air to complete the formation of the vapor deposited film (the gas-barrier film corresponds to the intermediate barrier layer Y in the present invention and in which the C concentration is less than 5%).

The microwave intensities and the plasma-treating times in the above regions were set to be 35 W and 3 seconds (organic/inorganic composite region α) and 600 W and 5 seconds (inorganic region β), respectively.

Figure 7:
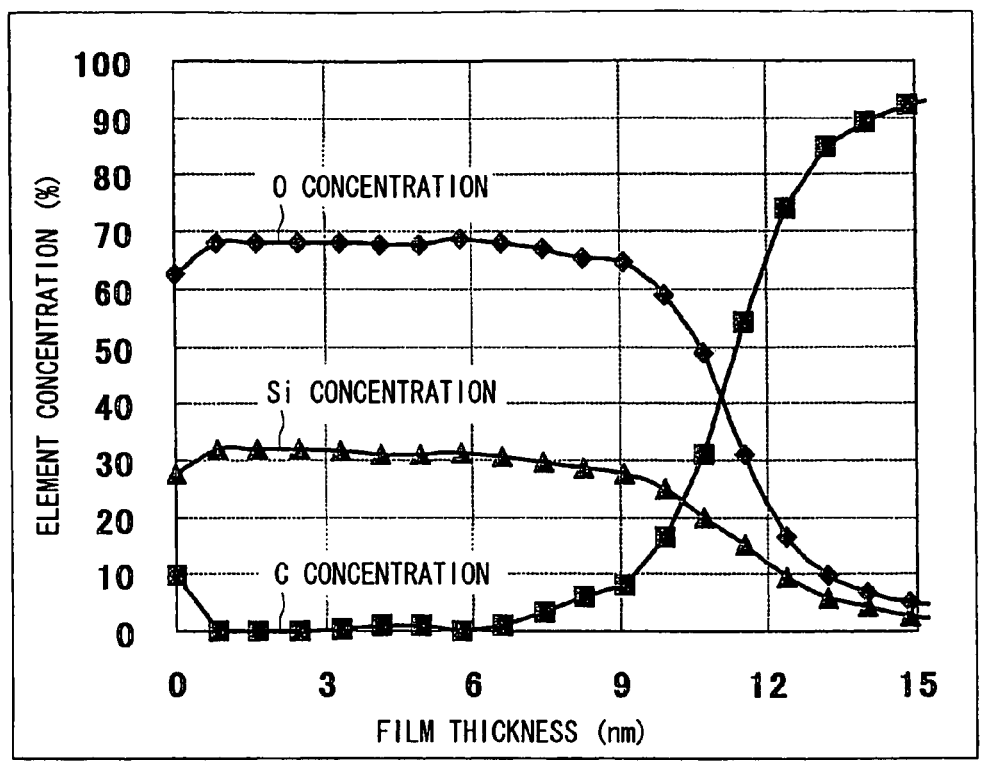
FIG. 7 is a diagram illustrating the composition profiles of silicon, oxygen and carbon in the direction of thickness of the vapor deposited film (Experiment 1) having an organic/inorganic composite region in the adhesive layer.
Figure 8:
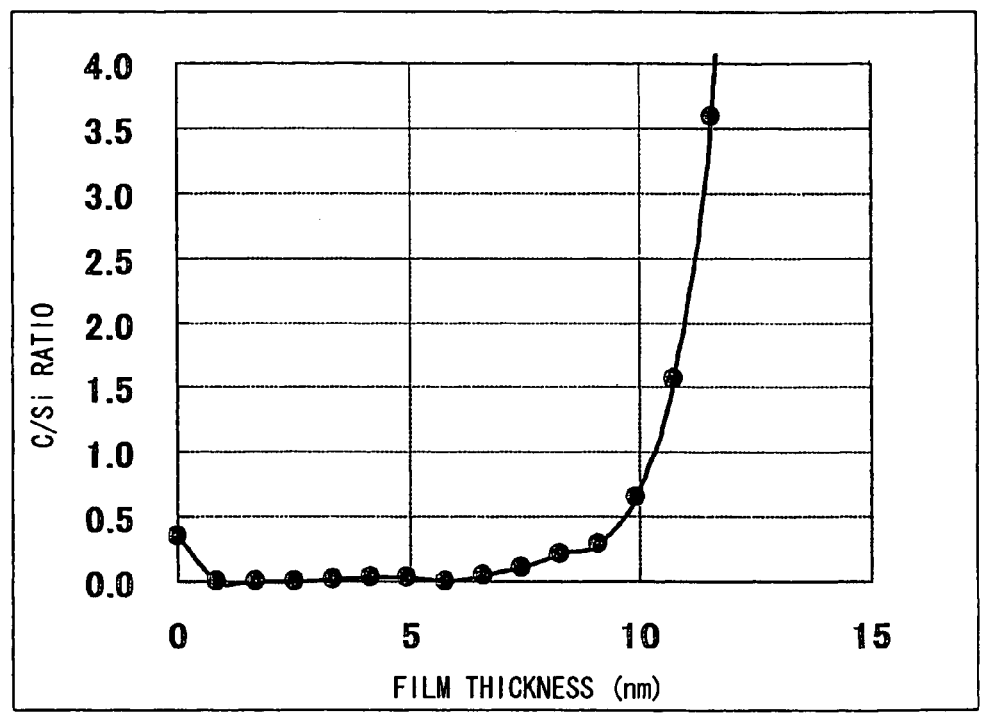
FIG. 8 is a diagram illustrating the element ratio (C/Si) of carbon and silicon in the vapor deposited film of FIG. 7 in the direction of thickness thereof.

FIG. 7 illustrates composition profiles of silicon, oxygen and carbon in the vapor deposited film in the direction of depth thereof as measured by the composition analytical method. FIG. 8 illustrates the element ratio (C/Si) of carbon

TABLE 1

| | Outer surface | | | | | Intermediate barrier layer | | Amount of decrease of film |
|---|---|---|---|---|---|---|---|---|
| | Element concentrations (%) | | | O/Si oxidation deg. x | Silicon bonding energy (eV) | Ave. silicon bonding energy (eV) | O/Si oxidation deg. x | After preserved at 55° C., 30% RH for 28 days |
| | C | O | Si | | | | | |
| Ex. 1 | 51.9 | 26.2 | 21.9 | 1.20 | 101.99 | 103.70 | 2.19 | 0.2 |
| Comp. Ex. 1 | 37.9 | 37.2 | 24.9 | 1.49 | 102.51 | 103.53 | 2.48 | 3.4 |
| Comp. Ex. 2 | 13.2 | 56.0 | 30.8 | 1.82 | 102.80 | 103.71 | 2.27 | 6.6 |
| Comp. Ex. 3 | 2.4 | 65.5 | 32.1 | 2.04 | 103.37 | 103.70 | 2.21 | 13.6 | and silicon in the direction of depth of the film. The analytical results of the composition indicated that the element ratio (O/Si) of oxygen and silicon, i.e., the degree of oxidation was in a range of 2.2 to 2.4 in the organic/inorganic composite region α in which the element ratio (C/Si) of carbon and silicon was in the range of 1.0 to 1.8. The element ratio (C/Si) of carbon and silicon in the organic/inorganic composite region α was not larger than 0.2.

Figure 9:
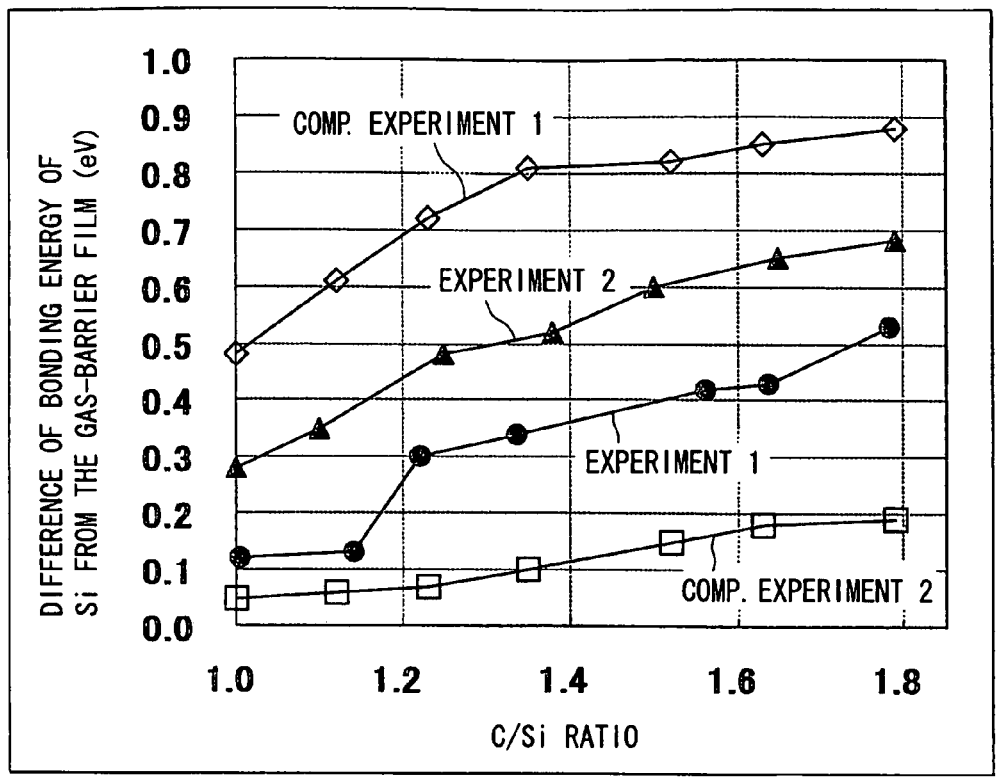
FIG. 9 is a diagram illustrating differences of bonding energy of a metal element (Si) from the gas-barrier film (corresponds to an intermediate barrier layer) in a region (organic/inorganic composite region) where the element ratio (C/Si) of carbon and silicon is in a range of 1.0 to 1.8 in the vapor deposited films of Experiments 1, 2 and in the Comparative Experiments 1, 2.

FIG. 9 illustrates a difference in the bonding energy (ΔM) of silicon (Si) in the organic/inorganic composite region a from the gas-barrier film (corresponds to the intermediate barrier layer Y).

Figure 10:
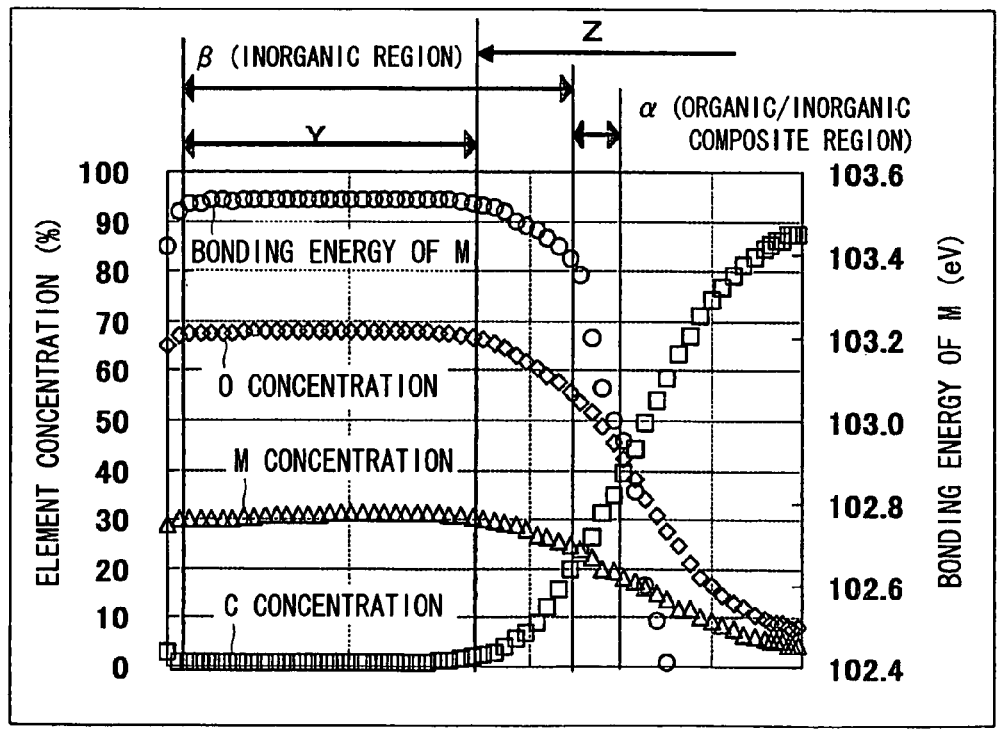
FIG. 10 is a diagram illustrating the element composition in the direction of thickness of the vapor deposited film of Experiment 1 and a bonding energy profile of the metal element (Si)

Further, FIG. 10 illustrates the element composition of the film in the direction of thickness thereof and the bonding energy profile of the metal element (Si).

The vapor deposited film was further evaluated for its heat resistance and adhesiveness. The evaluated results of the heat resistance were as shown in Table 2 which also shows a range of the bonding energy differences (ΔM), and the evaluated results of adhesiveness were as shown in Table 3.

Experiment 2

A film was formed by vapor deposition having, formed on the organic/inorganic composite region α, the inorganic region β containing a gas-barrier film therein in the same manner as in Experiment 1 but changing the microwave intensities and the plasma-treating times into 45 W and 3 seconds (organic/inorganic composite region α) and 600 W and 5 seconds (inorganic region β), respectively.

The analytical results of the composition of the vapor deposited film indicated that the element ratio (O/Si) of oxygen and silicon was in a range of 2.2 to 2.5 in the organic/inorganic composite region α in which the element ratio (C/Si) of carbon and silicon was in the range of 1.0 to 1.8. The element ratio (C/Si) of carbon and silicon, i.e., the degree of oxidation in the inorganic region β was not larger than 0.2.

Further, FIG. 9 illustrates differences in the bonding energy (ΔM) of silicon (Si) in the organic/inorganic composite region α from the gas-barrier film.

The vapor deposited film was further evaluated for its heat resistance and adhesiveness. The evaluated results of the heat resistance were as shown in Table 2 which also show a range of the bonding energy differences (ΔM), and the evaluated results of adhesiveness were as shown in Table 3.

Experiment 3

A film was formed by vapor deposition having, formed on the organic/inorganic composite region α, the inorganic region β containing a gas-barrier film therein in the same manner as in Experiment 1 but treating the organic/inorganic composite region α with the plasma for a period of time longer by 5 seconds than the treating time in Experiment 1.

Figure 11:
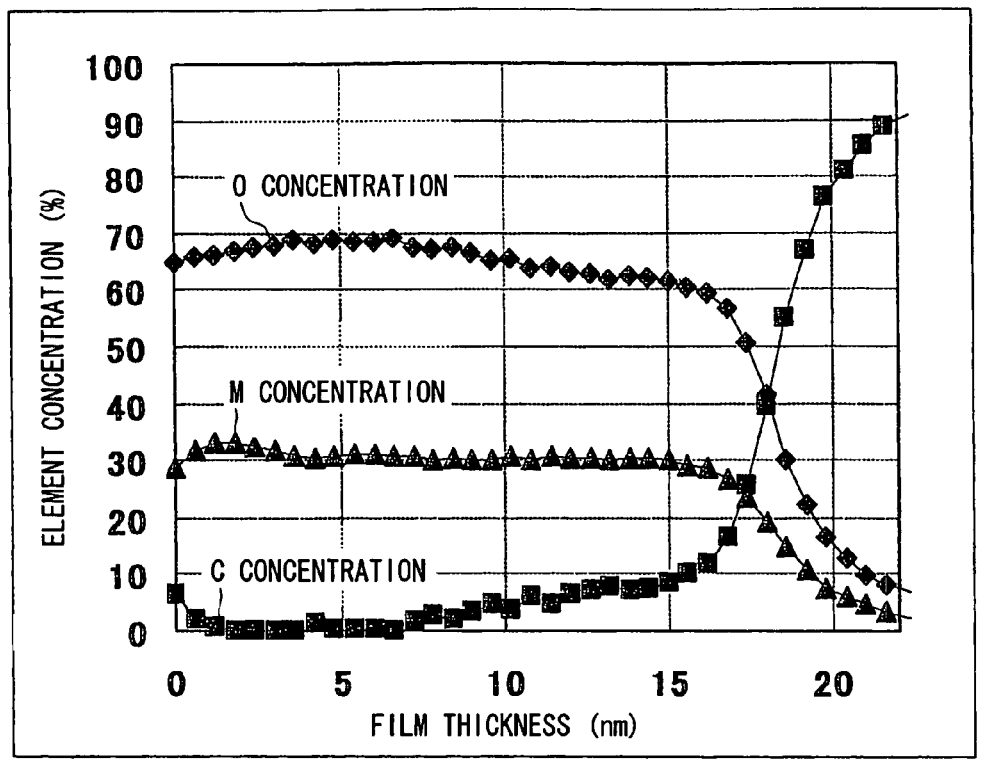
FIG. 11 is a diagram illustrating composition profiles of silicon, oxygen and carbon in the direction of thickness of a vapor deposited film of Experiment 3.

FIG. 11 shows the composition profiles of silicon, oxygen and carbon in the direction of depth of the film as measured by the composition analytical method and FIG. 12 illustrates the element composition in the direction of depth and the bonding energy profile of the metal element (Si). The analytical results of the composition indicated that the element ratio (O/Si) of oxygen and silicon, i.e., the degree of oxidation was in a range of 1.9 to 2.2 in the organic/inorganic composite region α in which the element ratio (C/Si) of carbon and silicon was in the range of 0.2 to 1.8. The element ratio (C/Si) of carbon and silicon in the inorganic region β was not larger than 0.2.

The vapor deposited film was further evaluated for its heat resistance and adhesiveness. The heat resistance was evaluated concerning the bonding energy of silicon in the organic/inorganic composite region α and were as shown in Table 2 which also shows a range of the bonding energy differences (ΔM) from the gas-barrier film, and the evaluated results of adhesiveness were as shown in Table 3.

Comparative Experiment 1

The apparatus and the PET bottle the same as those of Example 1 were used, 2.7 sccm of the HMDSO was introduced as the starting gas, and the treatment with the plasma was conducted at a microwave intensity of 35 W for 0.5 seconds to form a film (organic region) closely adhered onto the PET bottle base plate. Thereafter, 27 sccm of oxygen were introduced therein, and the treatment with the plasma was conducted at a microwave intensity of 600 W for 7.5 seconds to form an inorganic region β containing a gas-barrier film therein on the above closely adhered film.

The analytical results of the composition indicated that the element ratio (O/Si) of oxygen and silicon, i.e., the degree of oxidation was in a range of 1.9 to 2.2 in the organic/inorganic composite region α in which the element ratio (C/Si) of carbon and silicon was in the range of 1.0 to 1.8. The element ratio (C/Si) of carbon and silicon in the inorganic region β was not larger than 0.2.

FIG. 9 illustrates a difference in the bonding energy (ΔM) of silicon (Si) in the organic/inorganic composite region α from the gas-barrier film.

The vapor deposited film was evaluated for its heat resistance to be as shown in Table 2 which also shows a range of the bonding energy differences (ΔM).

Comparative Experiment 2

A film was formed by vapor deposition in quite the same manner as in Experiment 1 but setting the microwave intensity to be 600 W and forming the organic region and the inorganic region for a total of 8 seconds. The analytical results of the composition indicated that the element ratio (O/Si) of oxygen and silicon, i.e., the degree of oxidation was in a range of 2.2 to 2.5 in the organic/inorganic composite region α in which the element ratio (C/Si) of carbon and silicon was in the range of 1.0 to 1.8. The element ratio (C/Si) of carbon and silicon in the inorganic region β was not larger than 0.2.

Further, FIG. 9 illustrates a difference in the bonding energy (ΔM) of silicon (Si) in the organic/inorganic composite region α from the gas-barrier film.

The vapor deposited film was evaluated for its heat resistance to be as shown in Table 3 which also shows a range of the bonding energy differences (ΔM).

TABLE 2

| | Range of difference of bonding energy from gas-barrier film (eV) | Si elution (ppb) after preserved at 55° C. for 28 days | |
|---|---|---|---|
| | | Filled at 23° C. | Filled at 87° C. |
| Experiment 1 | 0.1~0.55 | 85 | 81 |
| Experiment 2 | 0.3~0.7 | 88 | 92 |
| Experiment 3 | 0.3~0.55 | 87 | 91 |
| Comp. Experiment 1 | 0.5~0.9 | 105 | 175 |

In Experiment 3, the element ratio (C/Si) in the organic/inorganic composite region α is in a range of 0.2 to 1.8.

It will be learned from the results of Table 2 that adhesion to the base plate exhibits good heat resistance owing to the presence of both inorganic property and organic property maintaining good balance when the bonding energy of Si in the organic/inorganic composite region α is in a range lower by 0.1 to 0.7 eV than the bonding energy in the gas-barrier film (region where the C concentration is less than 5%) (i.e., when a difference in the bonding energy is in a range of 0.1 to 0.7 eV). When the difference of bonding energy (ΔM) from the gas-barrier film is larger than the range of 0.1 to 0.7 eV, however, the adhesion to the base plate becomes chiefly dependent on the organic component and becomes poorly resistant against the heat.

TABLE 3

|  | Range of difference of bonding energy from gas-barrier film (eV) | Oxygen permeation amount (cc/day/bottle) | |
| --- | --- | --- | --- |
|  |  | Before expanded | After expanded |
| Experiment 1 | 0.1~0.55 | 0.0015 | 0.0018 |
| Experiment 2 | 0.3~0.7 | 0.0016 | 0.0018 |
| Experiment 3 | 0.3~0.55 | 0.0016 | 0.0019 |
| Comp. Experiment 2 | 0.05~0.2 | 0.0016 | 0.0035 |

In Experiment 3, the element ratio (C/Si) in the organic/inorganic composite region α is in a range of 0.2 to 1.8.

It will be learned from the results of Table 3 that the film favorably adheres to the base plate owing to the presence of both inorganic property and organic property maintaining good balance when the difference of bonding energy (ΔM) from the gas-barrier film is in a range of 0.1 to 0.7 eV. When the difference of bonding energy (ΔM) from the gas-barrier film is smaller than the range of 0.1 to 0.7 eV, however, the adhesion to the base plate becomes chiefly dependent on the inorganic component and, therefore, becomes poor.

The invention claimed is:

1. A vapor deposited film formed on a surface of a base material by a plasma CVD method by using an organic metal compound and an oxidizing gas as reaction gases;
wherein said vapor deposited film is sectionalized into an adhesive layer on the side of the base material, an intermediate barrier layer and a surface protection layer, wherein each of said adhesive layer and said surface protection layer have a carbon concentration of not less than 5 element % on the total basis of a metal element (M), oxygen (O) and carbon (C) derived from said organic metal compound, and each of said adhesive layer, said intermediate barrier layer and said surface protection layer comprise a metal element (M), oxygen (O) and carbon (C), wherein the carbon concentration of said intermediate barrier layer is less than 5 element % on the total basis of a metal element (M), oxygen (O) and carbon (C) derived from said organic metal compound; said surface protection layer has the carbon (C) concentration higher than the oxygen (O) concentration and the metal element (M) concentration, and, at the outer surface of said surface protection layer, an element ratio (O/M) representing the degree of oxidation of the metal element (M) is not larger than 1.3, and the bonding energy of the metal element (M) of said surface protection layer is smaller than an average value of the bonding energy of the metal element (M) of said intermediate barrier layer by not less than 1.0 eV; and
in said intermediate barrier layer, the element ratio (O/M) representing the degree of oxidation of the metal element (M) on average is larger than 1.8 but is not larger than 2.4.

2. The vapor deposited film according to claim 1, wherein said adhesive layer includes an organic/inorganic composite region in which the element ratio (C/M) and the element ratio (O/M) satisfy the following formulas:

0.2<C/M<1.8, 1.5≦O/M, and the bonding energy of said metal element (M) of said adhesive layer is in a range lower by 0.1 eV to 0.7 eV than an average value of the bonding energy of the metal element (M) in said intermediate barrier layer.

3. The vapor deposited film according to claim 2, wherein a region present on an outer surface side of said organic/inorganic composite region has the element ratio (C/M) satisfying the following condition,

C/M≦0.2, wherein said region present on an outer surface side of said organic/inorganic composite region excludes said surface protection layer.

4. The vapor deposited film according to claim 1, wherein said adhesive layer includes an organic/inorganic composite region in which the element ratio (C/M) and the element ratio (O/M) satisfy the following formulas:

1.0<C/M<1.8, 2.0≦O/M, and the bonding energy of said metal element (M) of said adhesive layer is in a range lower by 0.1 eV to 0.7 eV than an average value of the bonding energy of the metal element (M) in said intermediate barrier layer.

5. The vapor deposited film according to claim 4, wherein a region present on an outer surface side of said organic/inorganic composite region has the element ratio (C/M) satisfying the following condition,

C/M≦0.2, wherein said region present on an outer surface side of said organic/inorganic composite region excludes said surface protection layer.

6. The vapor deposited film according to claim 2, wherein said organic/inorganic composite region has the bonding energy of the metal element (M) which gradually increases from the side of the base material toward an outer surface side of said organic/inorganic composite region, and a difference is not smaller than 0.1 eV between a maximum value and a minimum value of bonding energy of the metal element (M).

7. The vapor deposited film according to claim 1, wherein said organic metal compound is an organosilicon compound, and the metal (M) is silicon (Si).

8. The vapor deposited film according to claim 1, wherein said base material is a plastic material.

9. A plastic bottle having the vapor deposited film of claim 1 formed on the inner surface thereof.

* * * * *